United States Patent
Hendricks

[11] Patent Number: 5,999,114
[45] Date of Patent: Dec. 7, 1999

[54] DITHERED DIGITAL GAIN SCALAR/SUMMER

[75] Inventor: Paul David Hendricks, Coopersburg, Pa.

[73] Assignee: Lucent Technologies Inc., Murray Hill, N.J.

[21] Appl. No.: 08/976,105

[22] Filed: Sep. 16, 1997

Related U.S. Application Data

[60] Provisional application No. 60/051,709, Jul. 3, 1997.

[51] Int. Cl.[6] .................................................. H03M 1/20
[52] U.S. Cl. ................................. 341/131; 341/139
[58] Field of Search ................... 341/131, 139, 341/143

[56] References Cited

U.S. PATENT DOCUMENTS

| | | | |
|---|---|---|---|
| 5,144,308 | 9/1992 | Norsworthy | 341/131 |
| 5,191,331 | 3/1993 | Karema et al. | 341/131 |
| 5,410,310 | 4/1995 | Molnar | 341/143 |
| 5,530,442 | 6/1996 | Norsworthy et al. | 341/131 |
| 5,530,443 | 6/1996 | Borgen et al. | 341/131 |

OTHER PUBLICATIONS

Patent No. 5144308, filed on May 21, 1991 and issued on Sep. 1, 1992 to Norsworthy. Class: 341/131.
Patent No. 5483238, filed on Dec. 16, 1993 and issued on Jan. 9, 1996 to Norsworthy. Class: 341/131.

*Primary Examiner*—Michael Tokar
*Assistant Examiner*—Anh Tran
*Attorney, Agent, or Firm*—John P. Veschi

[57] ABSTRACT

A method of breaking up idle tones in a converter is used for gain scaling and summing of digital input signals. The invention achieves this object by introducing dither. Further, the invention optimizes the dither introduced by adapting the magnitude of the dither based on the value of the feedback gain factor of the converter. By adapting the dither in this way, the output idle channel noise can be essentially constant and independent of the scaling factor of the converter.

25 Claims, 8 Drawing Sheets

DITHERED DIGITAL GAIN SCALAR/SUMMER

BACKGROUND OF THE INVENTION

Priority of U.S. Provisional Application Ser. No: 60/051,709, filed Jul. 3, 1997, is hereby claimed. This application is related to copending application Ser. No. 09/975,901, entitled Converter Providing Digital Scaling and Mixing (Little 1), filed on even date herewith, and incorporated herein by reference. The copending application describes a converter for use in scaling and/or summing digital input signals, such as, for example, one-bit digital input signals, and is based on a sigma-delta architecture. As is known to those of skill in the art, sigma-delta architectures may introduce idle tones into an output signal. There thus exists a need for a mechanism for breaking up any idle tones in the converter described in the copending application.

SUMMARY OF THE INVENTION

A method is provided for breaking up idle tones in a converter used for gain scaling and/or summing of digital input signals. The invention achieves this by introducing dither. Further, the invention optimizes the dither introduced by adapting the magnitude of the dither based on the value of the feedback gain factor of the converter. By adapting the dither in this way, the output idle channel noise can be essentially constant and independent of the scaling factor of the converter.

DETAILED DESCRIPTION

Figure 7:
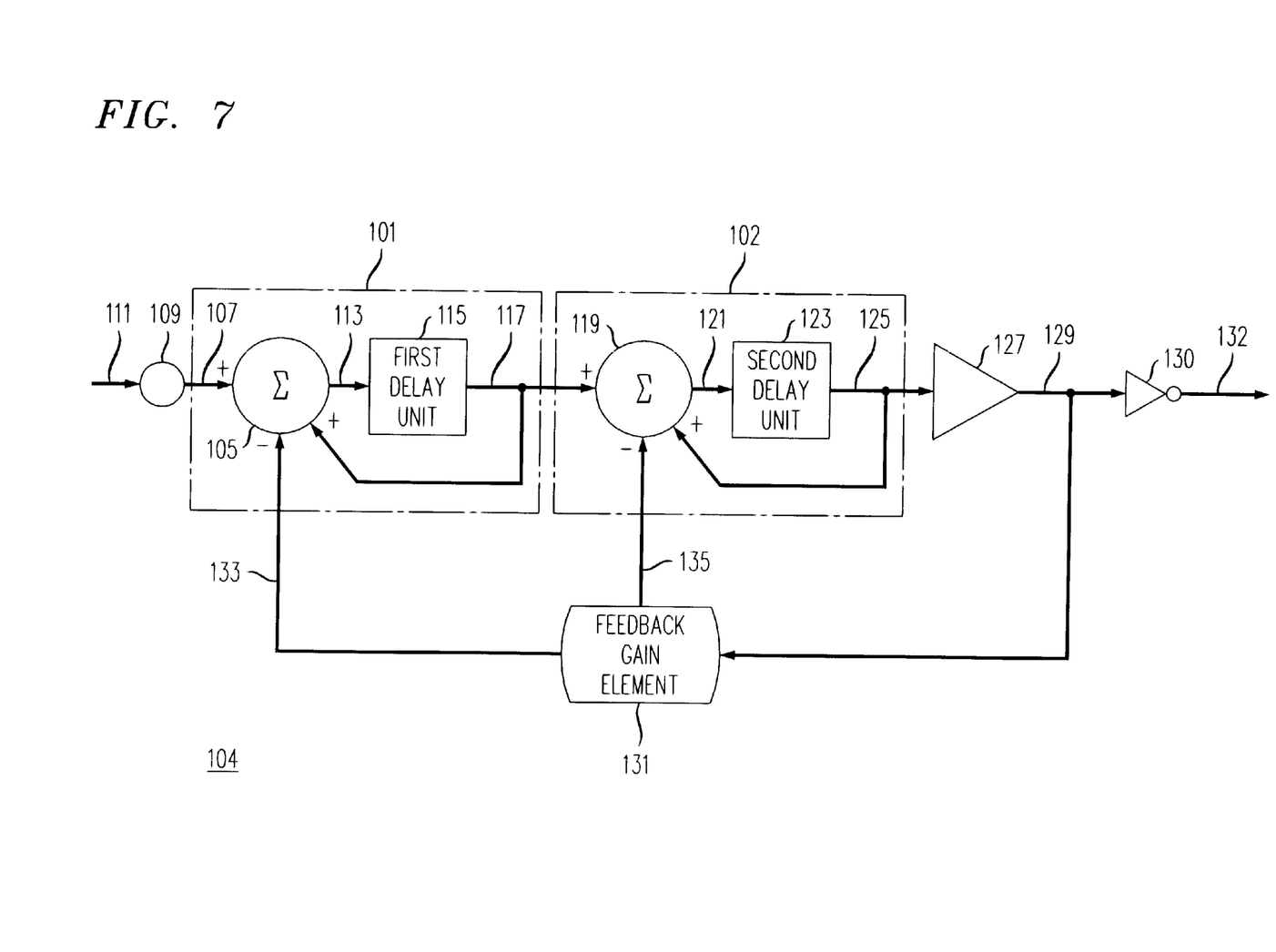
FIG. 7 is a simplified block diagram showing a first type of converter described in the copending application.
Figure 8:
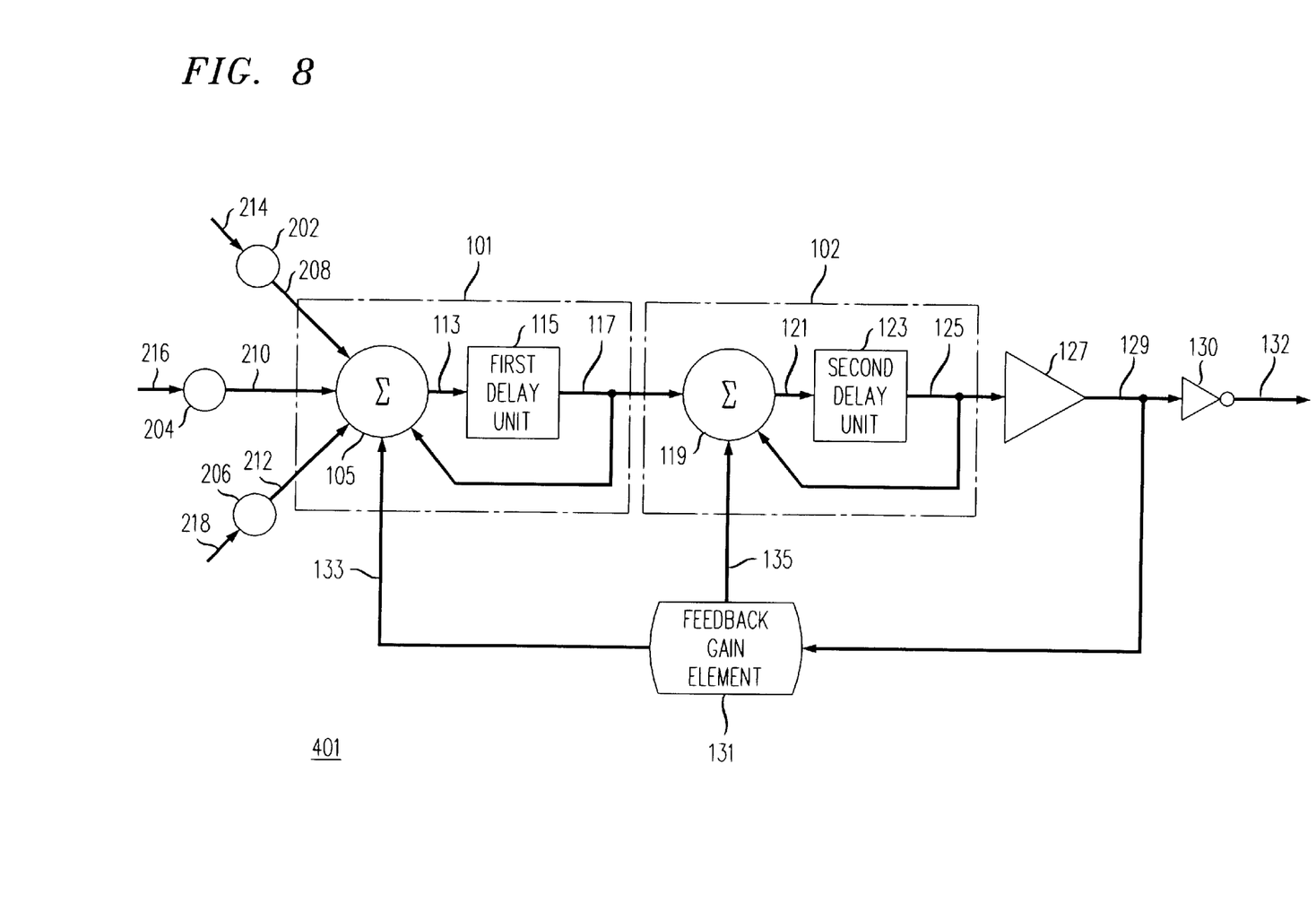
FIG. 8 is a simplified block diagram showing a second type of converter described in the copending application.

A converter is described in the aforementioned copending application, examples of which are also illustrated in FIGS. 7 and 8 of the present application. Converter 104, shown in FIG. 7, is a first type of converter including a first integrator 101 connected in series with a second integrator 102, a comparator 127, and a feedback gain element 131. An input signal provided to first integrator 101 is output in a scaled manner by comparator 127 according to a feedback factor of feedback gain element 131. Converter 104 also optionally includes an input gain element 109 and an inverter 130. When input gain element 109 is employed, converter 104 scales an input signal based on both the feedback factor of feedback gain element 131 and an input gain factor of input gain element 109. When inverter 130 is employed, the output of comparator 127 is inverted prior to being output from the converter. First integrator 101 includes a first summer 105 and a first delay unit 115. First summer 105 receives a gain adjusted signal 107, which is a gain adjusted version of an input signal 111, from input gain element 109. A first output 113 of first summer 105 is provided to first delay unit 115. A first delayed output 117 of first delay unit 115 is fed back to first summer 105, and is provided to second integrator 102. Second integrator 102 includes a second summer 119 and a second delay unit 123. A second output 121 of second summer 119 is provided to second delay unit 123. A second delayed output 125 of second delay unit 123 is fed back to second summer 119 and is provided to comparator 127. A comparator output 129 (or an inverted output 132 for circuits including inverter 130) represents a scaled version of input signal 111, and serves as an output signal of converter 104. Comparator output 129 is also fed back to feedback gain element 131 which provides a first feedback signal 133 to first summer 105 and a second feedback signal 135 to second summer 119.

In an operational example, converter 104 receives a Pulse Density Modulated (PDM) input signal stream on input line 111, and outputs a scaled version of the PDM input signal stream on output line 132. Input gain element 109 outputs a multibit gain-adjusted signal 107, comprising either an input gain factor or the complement of the input gain factor. First summer 105 also receives a multibit signal, such as, for example, a 12-bit signal, from feedback gain element 131. First summer 105 also receives a multibit signal from first delay unit 115. First summer 105 produces first output 113 which is provided to second summer 119 via first delay unit 115 as first delayed output 117.

Similarly, second summer 119 receives as multibit signals the first delayed output 117, second feedback signal 135, and second delayed output 125. Second summer 119 provides multibit second output 121 to comparator 127 as second delayed output 125 via second delay unit 123.

As is known in the art of sigma delta converters, comparator 127 receives multibit second delayed output 125 and produces therefrom a one-bit PDM signal stream provided on output line 129. The one-bit PDM signal stream produced by comparator 127 typically consists of the sign bits of the samples of multibit second delayed output 125. This PDM signal stream is also fed back to feedback gain element 131 to affect the first and second feedback signals 133 and 135 provided respectively to first summer 105 and second summer 119. The PDM signal stream output from converter 104 on output line 132 is a scaled version of the PDM signal stream input to converter 104 on input line 111. A scaling factor of converter 104 is the input gain factor divided by a feedback gain factor of feedback gain element 131.

As described in more detail in the copending application, the sign bit of multibit second delayed output 125, which is output by comparator 127 as comparator output 129, determines the sign of the first feedback signal 133 and thus determines if first summer 105 will subtract the feedback gain factor stored in feedback register 131, or will subtract the complement of the feedback gain factor. As is clear to one of skill in the art, when first summer 105 subtracts the complement of the feedback gain factor, it is essentially adding the feedback gain factor.

Similarly, the sign bit of multibit second delayed output 125, as comparator output 129, determines the sign of the second feedback signal 135 and thus determines if second summer 119 subtracts a multiple of the feedback gain factor or subtracts a multiple of the complement of the feedback gain factor when it receives the second feedback signal 135.

Gain adjusted signal 107, first output 113, first delayed output 117, second output 121, second delayed output 125, first feedback signal 133, and second feedback signal 135 are all multibit signals. Preferably, the sizes (i.e., number of bits) of these signals are selected to allow appropriate room for accumulation. Thus, for example, gain adjusted signal 107 and the first feedback signal 133 can each have 12 bits, while the second feedback signal has 13 bits. In such a case, first output 113 and first delayed output 117 can have, for example, 14 bits, while second output 121 and second delayed output 125 have, for example, 16 bits.

Operationally, more than one feedback register can be employed in feedback gain element 131 such that the feedback gain factor can be selected from the values stored in the feedback registers according to user input or program control. Similarly, more than one input gain value register can be employed in input gain element 109 such that the input gain factor can be selected according to user input or program control.

FIG. 8 shows converter 401 including a plurality of input gain elements, for example, three input gain elements 202, 204 and 206, providing gain-adjusted signals 208, 210 and 212, respectively, to first summer 105. Input gain elements 202, 204 and 206, each operating in a manner similar to input gain element 109 of converter 104, produce these gain-adjusted signals based on PDM input signals received on input lines 214, 216 and 218, respectively. The remaining elements of converter 401 are functionally similar to those of converter 104 shown in FIG. 7, and thus contain like designations. Converter 401 produces a one-bit PDM output signal stream on output line 132 that includes a summed version of scaled input signals relating to the PDM input signals received on input lines 214, 216 and 218.

Converter 401 can independently scale each input signal based on an input gain factor of the corresponding input gain element (202, 204 and 206) and the feedback gain factor of feedback gain element 131. Thus, the scaling factor for the input signal on input line 214 is a function of the input gain factor of input gain element 202 and the feedback gain factor, such as, for example, the input gain factor of input gain element 202 divided by the feedback gain factor. Similarly, the scaling factors of the input signals on input lines 216 and 218 are functions of the respective input gain factors of input gain elements 204 and 206 with respect to the feedback gain factor. For example, the scaling factor for the input signal on input line 216 is the input gain factor of input gain element 204 divided by the feedback gain factor, and the scaling factor for the input signal on input line 218 is the input gain factor for input gain element 206 divided by the feedback gain factor.

Figure 1:
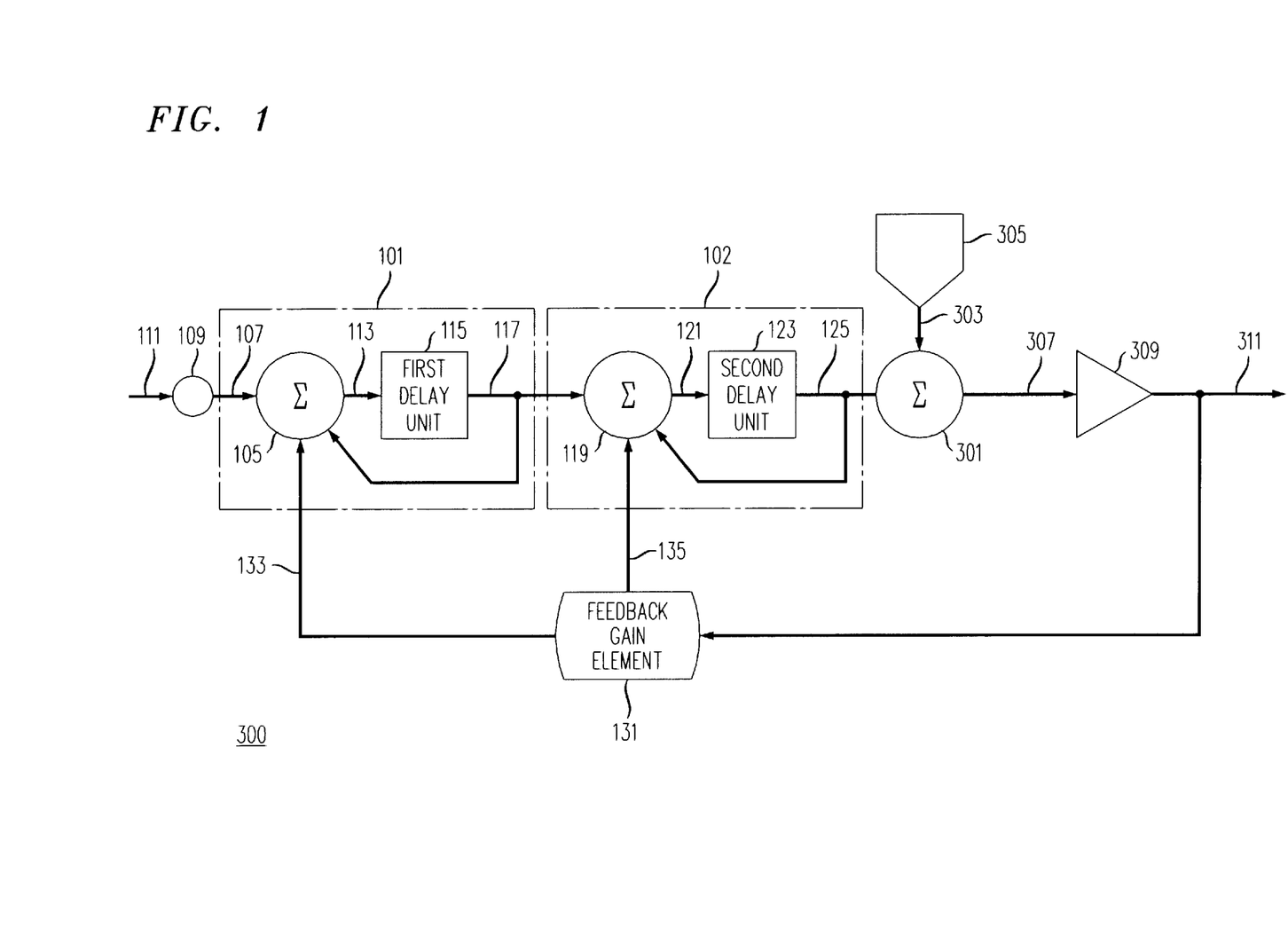
FIG. 1 is a simplified block diagram showing a first type of converter modified according to the invention.

Converter 300 of FIG. 1 includes, according to the invention, a third summer 301 receiving second output 125. Third summer 301 also receives a dither signal 303 from dither generator 305. Third summer 301 produces third output 307. Comparator 309 receives third output 307 and produces comparator output 311. Comparator output 311 is fed back to feedback gain element 131. Comparator output 311, which is a scaled and dithered version of input signal 111, can serve as the output of converter 300. Alternatively, converter 300 can include an inverter, such as inverter 130, to invert comparator output 311 prior to output from converter 300.

As discussed in more detail in the copending application, input gain element 109 has an input gain factor and feedback gain element 131 has a feedback gain factor. A scaling factor of converter 300 is a function of the input gain factor and the feedback gain factor. The magnitude of dither signal 303, according to the invention, is also a function of the feedback gain factor of feedback gain element 131. For example, the number of bits in the dither signal 303 can be one less than the number of bits in the feedback gain factor.

Figure 2:
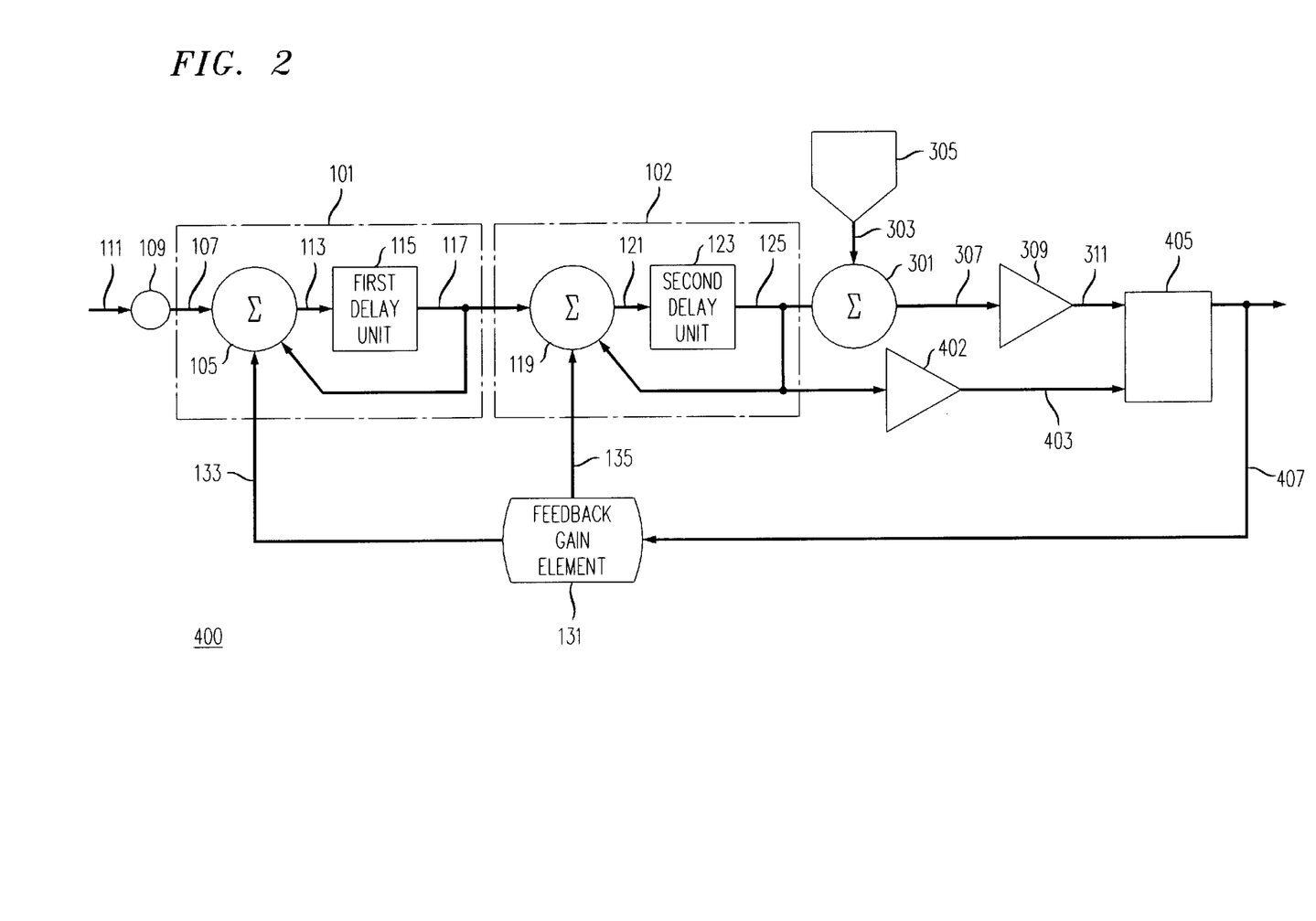
FIG. 2 is a simplified block diagram showing the first type of converter modified in an alternative manner according to the invention.

In converter 400 of FIG. 2, first comparator 402 receives the output of second integrator 102 and produces first output signal 403. Comparator 309, discussed previously, acts as a second comparator to receive dithered output signal 307 and produce signal 311 as a second output signal. Selector 405 selects between first output signal 403 and second output signal 311 to produce selected output signal 407. Selected output signal 407 is fed back to feedback gain element 131 and can also serve as the output signal of the converter as a scaled version of input signal 111. In this configuration, selector 405 determines whether to output first undithered output signal 403 or to output second dithered output signal 311. The decision made by selector 405 is based upon, for example, user input, program control or any other factor which will determine the utility of incorporating dither into the output of the converter. As before, selected output 407 can be inverted prior to being output from the converter.

Figure 3:
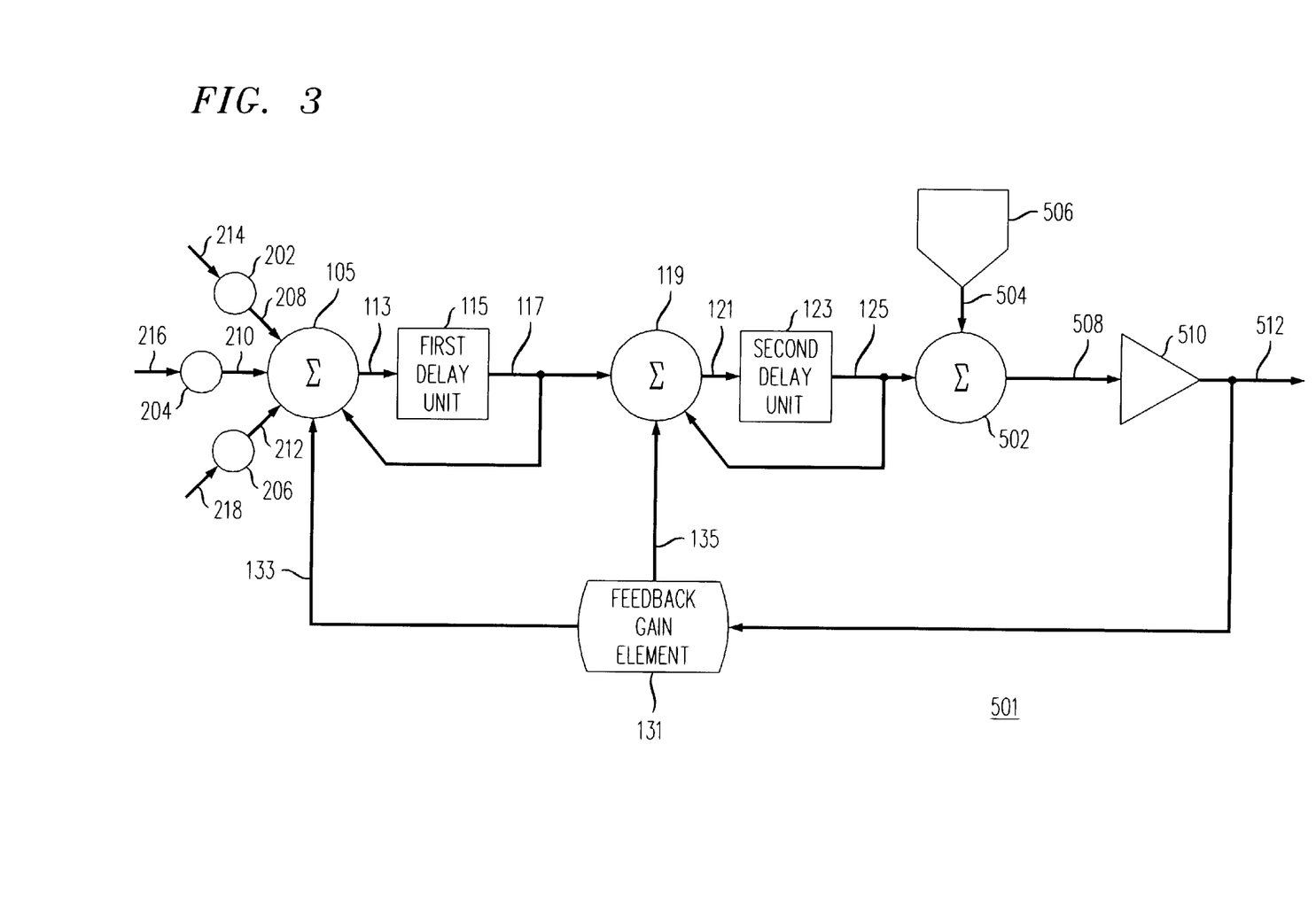
FIG. 3 is a simplified block diagram showing a second type of converter modified according to the invention.

Converter 501 of FIG. 3 incorporates dithering into the second type of Little converter according to the copending application. As described earlier with respect to FIG. 8, first summer 105 receives a plurality of gain adjusted input signals from a plurality of input gain elements such as, for example, the three input gain elements 202, 204 and 206 shown in FIG. 3. To incorporate dither, third summer 502 receives second output 125 from second delay unit 123. Third summer 502 also receives dither signal 504 from dither generator 506. Third output 508 is provided from third summer 502 to comparator 510. Comparator output 512, as the output of the circuit, is fed back to feedback gain element 131 and represents a dithered, scaled and summed version of input signals 214, 216 and 218. This embodiment can also, of course, incorporate a selector such as selector 405 shown in FIG. 2 to select between a dithered output signal and an undithered output signal, and can also incorporate an inverter to invert comparator output 512 prior to output from the circuit.

Figure 4:
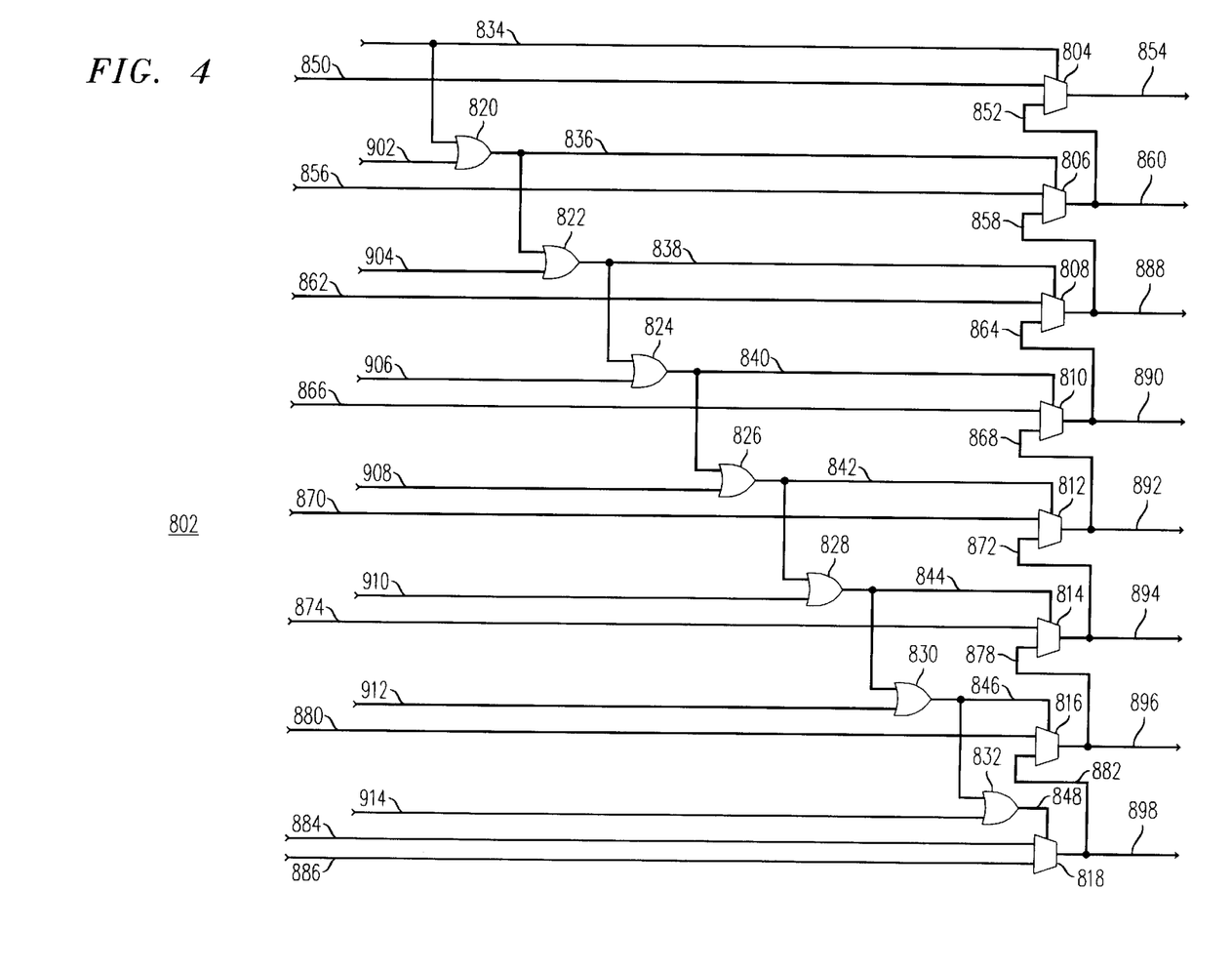
FIG. 4 is a simplified schematic diagram showing a portion of a dither generator according to the invention.

FIG. 4 provides an example of a portion of a dither generator, such as dither generator 305, that determines the number of dither bits to provide in a dither signal, such as dither signal 303. This portion of the dither generator, designated as 802, includes a plurality of multiplexers, such as, for example, multiplexers 804, 806, 808, 810, 812, 814, 816 and 818. This portion 802 also includes a plurality of OR-gates such as, for example, OR-gates 820, 822, 824, 826, 828, 830 and 832.

Each of the multiplexers 804–818 has a select input. The select input for multiplexer 804 is supplied by bit line 834. The select input for multiplexer 806 is supplied by bit line 836, which contains the output of OR-gate 820. Similarly, the select inputs of multiplexers 808–818 are supplied by bit lines 838–848 as the outputs, respectively, of OR-gates 822–832. Multiplexers 804–818 each select from two inputs based upon the value presented to its select input, and passes the selected input as its output. For example, multiplexer 804 selects between the value on bit line 850 and the value on bit line 852 based on the select input provided on bit line 834. For example, if multiplexer 804 receives a logic 1 value on its select input from bit line 834, then multiplexer 804 selects the value on bit line 850 to be output on bit line 854. Similarly, multiplexer 806 selects between the value on bit line 856 and the value on the bit line 858 according to the value on bit line 836 and provides the selected value on output bit line 860. Multiplexers 808–818 operate in a similar fashion, selecting between inputs 862–886 to provide outputs 888–898.

Bit lines 902–914 provide input to OR-gates 820–832. OR-gates 820–832 are arranged in an order from a most significant OR-gate 820 cascading down to a least significant OR-gate 832. Thus, if any of OR-gates 820–832 outputs a logical 1, every OR-gate of less significance will also output a logical 1. For example if OR-gate 822 outputs a logical 1 on bit line 838, the logical 1 will also be provided to OR-gate 824 yielding a logical 1 on bit line 840. The logical 1 on bit line 840 will consequently result in a logical 1 to OR-gate 826, resulting in a logical 1 on bit line 842.

Operationally, the value represented by bit lines 834 and 902–914 corresponds to the most significant bits of the feedback gain factor. This value can be provided by a connection between dither generator 305 and feedback gain element 131, or can be stored in dither generator 305 in, for example, a register. The value represented on bit lines 850, 856, 862, 866, 870, 874, 880, 884 and 886 represents a pseudo-random generated dither signal with the most significant bit appearing on bit line 850 and the least significant of these bits appearing on bit line 886.

In one example, dither generation portion 802 affects only the most significant bits of a multibit dither signal, such as, for example, a 16-bit dither signal, wherein the least significant bits are automatically passed along from dither generator 305 and only the most significant bits are affected. Thus, for example, a pseudo-random 16-bit dither signal comprising bits 0–15 can be generated, with bit 15 being input to line 850, bit 14 being input to line 856, bit 13 being input to bit line 862, bit 12 being input to bit line 866, bit 11 being input to bit line 870, bit 10 being input to bit line 874, bit 9 being input to bit line 880, bit 8 being input to bit line 884 and bit 7 being input to bit line 886. The least significant bits, such as, for example, bits 0–7, will automatically be output as part of the dither signal. In this example, the feedback gain factor is employed to influence the most significant bits of the dither signal, each of which may or may not be output on bit lines 854, 860 and 888–898. Bit lines 852, 858, 864, 868, 872, 878 and 882 are provided for sign extension purposes.

Figure 5:
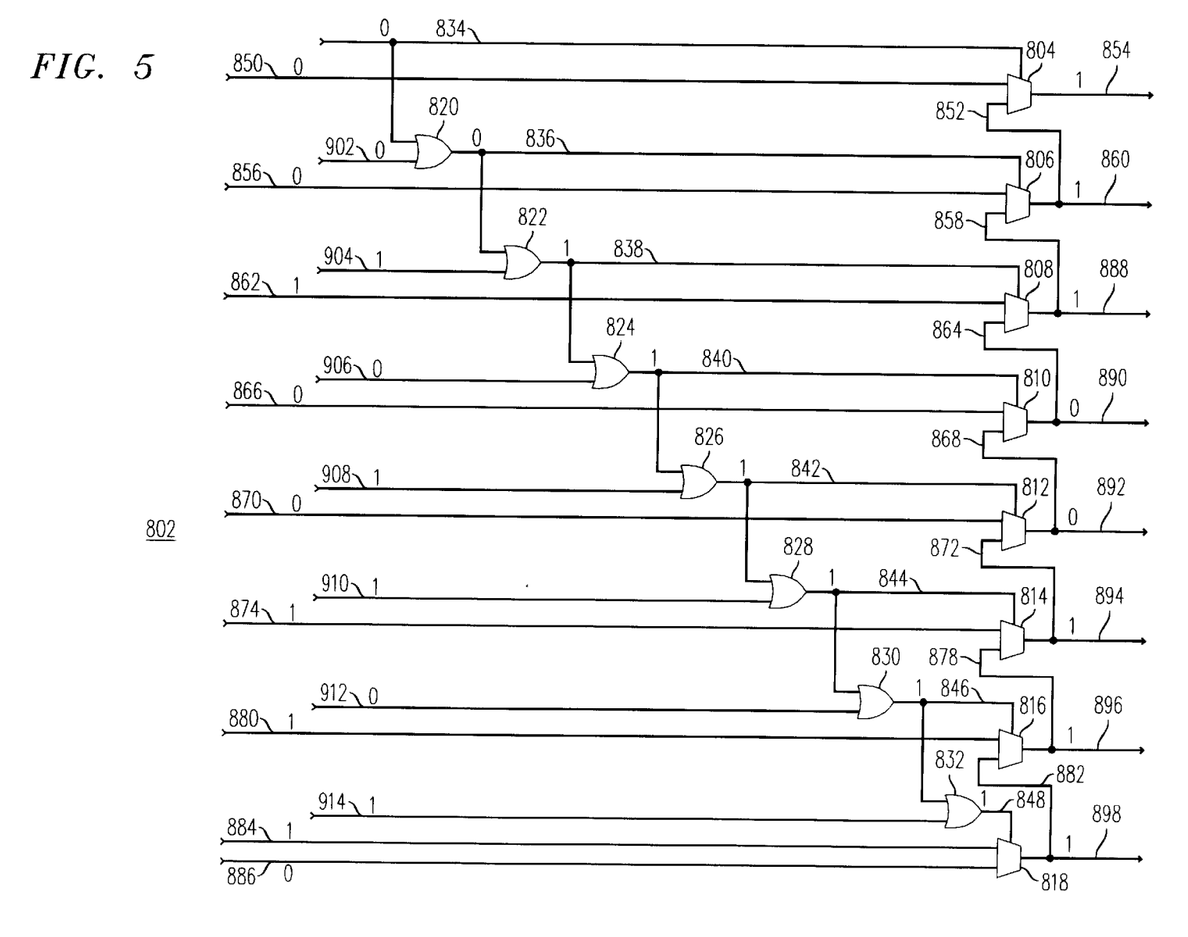
FIG. 5 provides an operational example of the dither generator of FIG. 4.

FIG. 5 provides an operational example. Here, the most significant bits of the feedback gain factor, represented respectively on bit lines 834 and 902–914, are 00101101. The pseudo-random generated dithered bits appearing respectively on bit lines 850, 856, 862, 866, 870, 874, 880, 884 and 886, are 001001110. The 0 on bit line 834, representing the most significant bit of the feedback gain factor, causes multiplexer 804 to select the value on bit line 852 to be output on bit line 854. Similarly, the 0 on bit line 834 and the 0 on bit line 902, representing the two most significant bits of the feedback gain factor, cause OR-gate 820 to output a 0 on bit line 836 which thus causes multiplexer 806 to output the value on bit line 858 as output on bit line 860.

The 1 on bit line 904, representing the third most significant bit of the feedback gain factor, causes OR-gate 822 to output a 1 on bit line 838. Multiplexer 808, in response to the 1 on bit line 808, outputs the value on bit line 862 onto bit line 888. This value is a 1 which is sign extended via bit lines 858 and 852 onto bit lines 860 and 854. The 1 on bit line 838 also cascades through OR-gates 824–832 causing each of them to output a 1 as the select input to multiplexers 810–818. This causes the values on bit lines 866, 870, 874, 880 and 884 to be output respectively onto bit lines 890–898.

The output dither signal, on bit lines 854, 860, and 888–898, which in this example is in two's complement form, has a magnitude of roughly one-half the magnitude of the feedback gain factor since the most significant bit of the output signal, excluding sign bits, is on bit line 890, the fourth most significant bit line of the output signal, whereas the feedback gain factor has an initial one value on bit line 862, the third most significant bit line in the feedback gain factor. Thus, according to the structure of the dither generator shown in FIGS. 4 and 5, the magnitude of the dither signal output from the dither generator is roughly half of the feedback gain factor since the dither signal has one less significant bit than the feedback gain factor.

Figure 6:
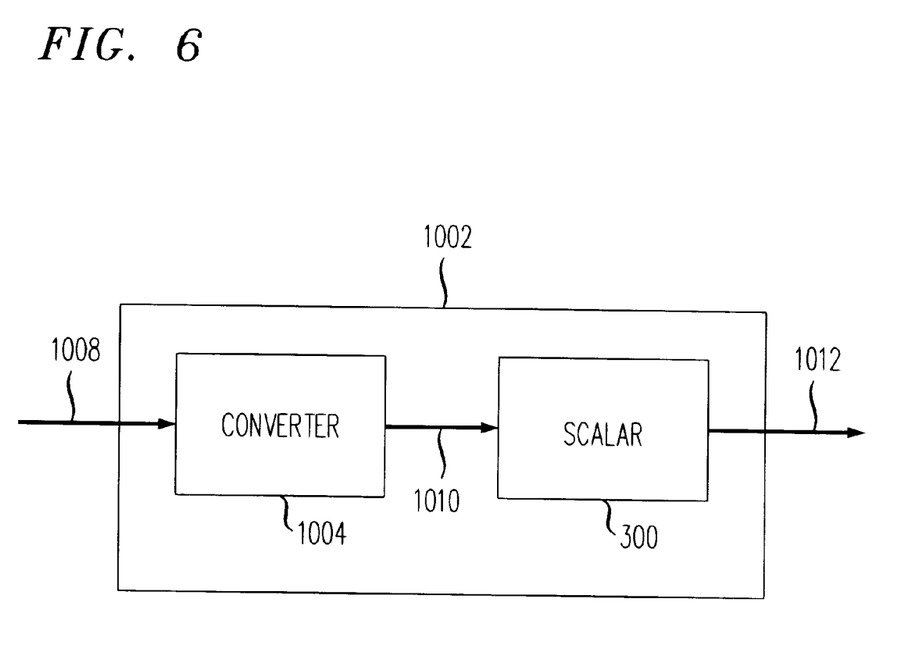
FIG. 6 is a simplified block diagram showing an interface unit incorporating a converter modified according to the invention.

Interface unit 1002 of FIG. 6 includes converter 1004 and scalar 300, shown in detail in FIG. 1. Converter 1004 receives input signal 1008 and converts input signal 1008 into one-bit signals provided on line 1010. Converter 1004 can be, for example, a digital-to-digital converter, or an analog-to-digital converter, as described in more detail in the copending application. Scalar 300 receives the PDM signals from line 1010 and produces output signals 1012 as scaled and dithered versions of the PDM signals. According to the invention, the dither incorporated into output signal 1012 will be a function of the feedback gain factor in scalar 300.

Thus, operationally, the invention enables a method of providing dither to a scalar, including the steps of determining the number of bits, including a sign bit, of the feedback gain factor and providing one less number of bits of dither. The step of providing the one less number of bits of dither includes, for example, associating a unique dither bit with each bit of the feedback gain factor, except for the most significant bit of the feedback gain factor. The step of determining the number of bits in the feedback gain factor includes, for example, determining a magnitude of the feedback gain factor by locating a position of a most significant logic "1" in the feedback gain factor. The step of providing the dither bits includes, for example, providing the dither bit associated with each position less than or equal to the position of the most significant logic "1" in the feedback gain factor. A converter, such as a scalar or scalar/summer, is thus provided with an adaptive dithering mechanism for use in breaking up idle tones created by the converter.

The invention claimed is:

1. A converter, comprising:

a first summer adapted to produce a first output;

an input gain element connected to receive an input signal and provide a gain-adjusted signal to the first summer;

a first delay unit adapted to receive the first output, produce a first delayed output and provide the first delayed output to the first summer;

a second summer adapted to receive the first delayed output and produce a second output;

a second delay unit adapted to receive the second output, produce a second delayed output and provide the second delayed output to the second summer;

a third summer adapted to receive the second output and produce a third output;

a dither generator adapted to provide a dither signal to the third summer;

a comparator adapted to receive the third output and produce a comparator output; and a feedback gain element adapted to receive the comparator output and produce a gain adjusted comparator output and a multiplied comparator output, the gain adjusted comparator output to be provided to the first summer, and the multiplied comparator output to be provided to the second summer, whereby the comparator output represents a scaled and dithered version of the input signal.

2. A converter as recited in claim 1, wherein the input gain element has an input gain factor and the feedback gain element has a feedback gain factor, a scaling factor of the converter being a function of the input gain factor and the feedback gain factor, and wherein the magnitude of the dither signal is a function of the magnitude of the feedback gain factor.

3. A converter as recited in claim 2, wherein the number of bits in the dither signal is one less than the number of bits in the feedback gain factor.

4. A converter, comprising:

n integrators ($n \geq 2$) connected in series with one another;

a dither generator adapted to dither the output of the nth integrator;

a comparator adapted to receive the dithered output signal and produce an output signal; and a feedback gain element adapted to receive the output signal and providing gain scaled feedback signals to the n integrators, whereby the output signal represents a scaled version of an input signal provided to the first integrator.

5. A converter as recited in claim 4, wherein the feedback gain element has a feedback gain factor and the magnitude of the dither signal is a function of the feedback gain factor.

6. A converter as recited in claim 5, wherein the number of bits in the dither signal is one less than the number of bits in the feedback gain factor.

7. A converter, comprising:

n integrators ($n \geq 2$) connected in series, each of the first through n-1th integrators adapted to provide an output to a following integrator;

a dither generator adapted to dither the output of the nth integrator;

a first comparator adapted to receive the output of the nth integrator and produce a first output signal;

a second comparator adapted to receive the dithered output signal and produce a second output signal;

a selector adapted to receive the first output signal and the second output signal and produce a selected output signal; and a feedback gain element adapted to receive the selected output signal and provide gain scaled feedback signals to the n integrators, wherein the selected output signal represents a scaled version of an input signal provided to the first integrator.

8. A converter, comprising:

a first summer adapted to produce a first output;

an input gain element connected to receive an input signal and provide a gain-adjusted signal to the first summer;

a first delay unit adapted to receive the first output, produce a first delayed output and provide the first delayed output to the first summer;

a second summer adapted to receive the first delayed output and produce a second output;

a second delay unit adapted to receive the second output, produce a second delayed output and provide the second delayed output to the second summer;

a third summer adapted to receive the second output and produce a third output;

a dither generator adapted to provide a dither signal to the third summer;

a first comparator adapted to receive the second output and produce a first comparator output;

a second comparator adapted to receive the third output and produce a second comparator output;

a selector adapted to receive the first comparator output and the second comparator output and outputting a selected one of the comparator outputs as a selected output; and a feedback gain element adapted to receive the selected output and produce a gain adjusted comparator output and a multiplied comparator output, the gain adjusted comparator output to be provided to the first summer, and the multiplied comparator output to be provided to the second summer, whereby the comparator output represents a scaled version of the input signal.

9. A circuit, comprising:

a converter adapted to receive PDM signals representative of signal samples and produce a scaled version of the PDM signals;

a dither generator adapted to dither the scaled version of the PDM signals, and produce an output signal therefrom.

10. A circuit as recited in claim 9, wherein the scaled version of the PDM signals is a function of an input gain factor and a feedback gain factor.

11. A circuit as recited in claim 10, wherein the dither signal is a function of the feedback gain factor.

12. A circuit as recited in claim 11, wherein the number of bits in the dither signal is one less than the number of bits in the feedback gain factor.

13. A circuit as recited in claim 12, wherein the dither generator comprises a plurality of multiplexers, each multiplexer having a select input, each multiplexer adapted to receive a corresponding dither bit and output the corresponding dither bit upon receiving an active signal on the select input.

14. A circuit as recited in claim 13, wherein the select input of each multiplexer is connected to receive a corresponding bit of the feedback gain factor, such that each multiplexer is adapted to output the corresponding dither bit when the corresponding bit of the feedback gain factor is in an active state.

15. A circuit as recited in claim 14, wherein the dither generator further comprises a plurality of OR gates, one less in number than the multiplexers, a most significant of the OR gates connected to receive two most significant bits of the feedback gain factor and provide an output to the select input of a second most significant multiplexer and to a second most significant OR gate, each other OR gate connected to receive an output of an immediately higher significant OR gate and the corresponding bit of the feedback gain factor and provide an output to the select input of the corresponding multiplexer.

16. A circuit as recited in claim 15, wherein a least significant multiplexer is connected to receive two corresponding bits of the dither signal, and each other multiplexer is connected to receive an output of an immediately less significant OR gate and the corresponding bit of the dither signal.

17. A scalar/summer, comprising:

a first summer producing a first output;

a plurality of input gain elements connected to receive corresponding input signals and provide gain-adjusted signals to the first summer;

a first delay unit adapted to receive the first output, produce a first delayed output and provide the first delayed output to the first summer;

a second summer adapted to receive the first delayed output and produce a second output;

a second delay unit adapted to receive the second output, produce a second delayed output and provide the second delayed output to the second summer;

a third summer adapted to receive the second output and produce a third output;

a dither generator adapted to provide a dither signal to the third summer;

a comparator adapted to receive the third output and produce a comparator output; and a feedback gain element adapted to receive the comparator output and produce a gain adjusted comparator output and a multiplied comparator output, the gain adjusted comparator output to be provided to the first summer, and the multiplied comparator output to be provided to the second summer, wherein the comparator output contains a summed version of scaled input signals.

18. A scalar/summer as recited in claim 17, wherein each input gain element has a corresponding input gain factor and the feedback gain element has a feedback gain factor, a scaling factor for each input signal being a function of the corresponding input gain factor and the feedback gain factor, and wherein the magnitude of the dither signal is a function of the magnitude of the feedback gain factor.

19. A scalar/summer as recited in claim 18, wherein the number of bits in the dither signal is one less than the number of bits in the feedback gain factor.

20. An interface unit, comprising:

a converter adapted to receive an analog input signal and produce one-bit signals therefrom; and a scalar adapted to receive the one-bit signals and produce a scaled version of the one-bit signals, wherein the second order sigma-delta scalar includes two integrators connected in series and adapted so that an output of the first integrator is provided as input to the second integrator;

a summer adapted to receive an output of the second integrator;

a dither generator adapted to provide a dither signal to the summer;

a comparator adapted to receive an output of the summer and produce an output signal; and a feedback gain element adapted to receive the output signal and provide gain scaled feedback signals to the integrators, wherein a magnitude of the dither signal is a function of a magnitude of a feedback gain factor provided to the first integrator.

21. An interface unit as recited in claim 20, wherein the number of bits in the dither signal is one less than the number of bits in the feedback gain factor.

22. A method of providing dither to a scalar that scales an input signal based on a feedback gain factor, the method comprising the steps of:

determining N as the number of bits, including a sign bit, of the feedback gain factor; and providing N-1 bits of dither.

23. A method as recited in claim 22, wherein the providing step includes associating a unique dither bit with each bit of the feedback gain factor except for the most significant bit of the feedback gain factor.

24. A method as recited in claim 23, wherein the determining step includes determining a magnitude of the feedback gain factor by locating a position of a most significant 1 in the feedback gain factor.

25. A method as recited in claim 24, wherein the providing step includes providing the dither bit associated with each position less than or equal to the position of the most significant 1 in the feedback gain factor.

* * * * *